United States Patent
Vinson et al.

(10) Patent No.: US 7,248,472 B2
(45) Date of Patent: Jul. 24, 2007

(54) AIR DISTRIBUTION SYSTEM

(75) Inventors: Wade D. Vinson, Magnolia, TX (US); Jeffery M. Giardina, Cypress, TX (US); Joseph R. Allen, Tomball, TX (US); Christopher G. Malone, Loomis, CA (US); Chandrakant Patel, Fremont, CA (US); David M. Paquin, Cypress, TX (US); Rich Bargerhuff, Spring, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 189 days.

(21) Appl. No.: 11/131,710

(22) Filed: May 18, 2005

(65) Prior Publication Data

US 2005/0259393 A1 Nov. 24, 2005

Related U.S. Application Data

(60) Provisional application No. 60/573,658, filed on May 21, 2004.

(51) Int. Cl.
*H05K 7/20* (2006.01)

(52) U.S. Cl. .................................... 361/694

(58) Field of Classification Search ............... 361/694, 361/676, 690, 692, 695, 677; 439/487; 62/263, 62/259.2

See application file for complete search history.

(56) References Cited

U.S. PATENT DOCUMENTS

| | | | |
|---|---|---|---|
| 5,860,291 A * | 1/1999 | Johnson et al. | 62/259.2 |
| 6,031,721 A | 2/2000 | Bhatia | |
| 6,262,892 B1 | 7/2001 | Bhatia | |
| 6,299,408 B1 | 10/2001 | Bhatia | |
| 6,920,797 B1 * | 7/2005 | Wang | 73/861 |
| 2001/0036061 A1 * | 11/2001 | Donahoe et al. | 361/687 |
| 2003/0128525 A1 * | 7/2003 | Berry et al. | 361/726 |
| 2003/0153259 A1 | 8/2003 | Lee et al. | |
| 2003/0155106 A1 | 8/2003 | Malone et al. | |
| 2003/0169567 A1 | 9/2003 | Tantoush et al. | |
| 2003/0184972 A1 | 10/2003 | Saeki et al. | |
| 2003/0202878 A1 | 10/2003 | Huang et al. | |
| 2004/0004813 A1 | 1/2004 | Coglitore et al. | |
| 2004/0246676 A1 | 12/2004 | Barr et al. | |

* cited by examiner

*Primary Examiner*—Chandrika Prasad

(57) ABSTRACT

A computer system comprising a plurality of electronic components disposed within a chassis. The electronic components generate a cooling load of at least 50 CFM at 2 inches of water or greater. An air mover is disposed within said chassis and is operable to generate airflow of at least 50 CFM at 2 inches of water or greater. An air distribution system is coupled to the air mover and is operable to distribute the airflow to the plurality of electronic components.

22 Claims, 3 Drawing Sheets

AIR DISTRIBUTION SYSTEM

CROSS-REFERENCE TO A RELATED APPLICATION

The present application claims the benefit of, and incorporates by reference, provisional application Ser. No. 60/573,658, filed May 21, 2004, and entitled "Transverse Mounted Air Movers with Curved Inlet/Outlet Plenums in a Server Chassis."

BACKGROUND

Computer system designs that seek to increase computational power while reducing the size of computer equipment create many challenges with controlling the temperature within these 'dense' computer systems. Increasing the computational power of computer systems often results in the utilization of high power components that generate high levels of heat. Reducing the size of the computer system often involves packaging components in close proximity to each other, therefore restricting airflow through the system. The combination of high power, high heat generating components and compact design is pushing the limits of current air-cooled systems.

Air-cooled systems often utilize an array of fans to move air from the environment, through a computer enclosure, and back to the environment. As the air passes through the enclosure it comes in thermal contact with, and absorbs heat from, the heat generating components within the enclosure. The heat transfer rate that can be achieved by an air-cooled system is a function of the volumetric flow rate and static pressure of air that can be moved through the enclosure.

Therefore, as can be appreciated, there remains a need in the art for air cooling systems for use with dense computer systems.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
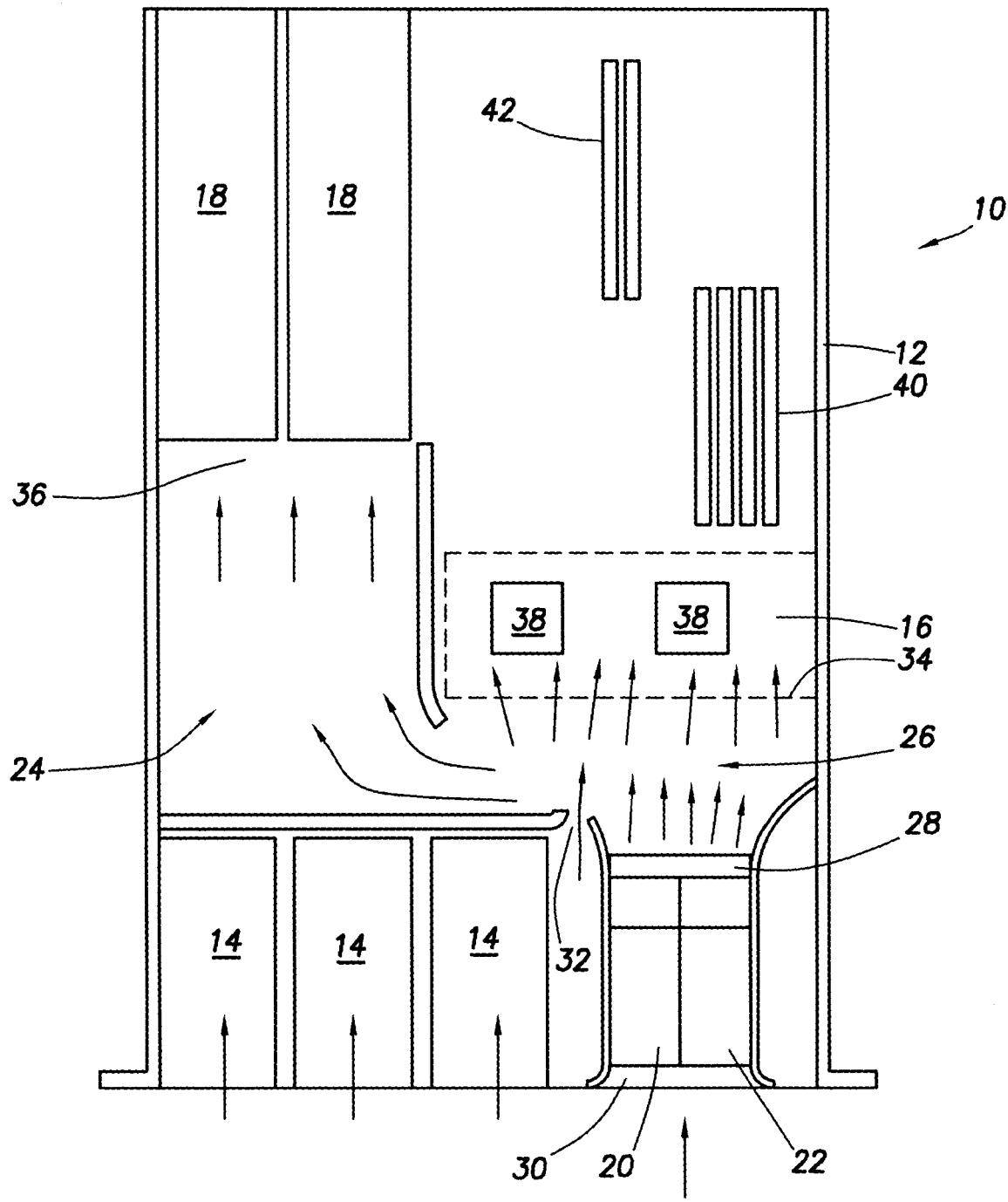
FIG. 1 shows a computer system comprising an air distribution system in accordance with embodiments of the invention.

Referring now to FIG. 1, computer system 10 comprises chassis 12, hard drives 14, processor heat sink 16, power supplies 18, primary air mover 20, backup air mover 22, and air distribution system 24. Air distribution system 24 comprises plenum 26 and flow divider 28. Plenum 26 comprises primary inlet 30, suction inlet 32, heat sink outlet 34, and power supply outlet 36.

Computer system 10 is a dense computer system such as a rack-mountable server. All of the electronic components within chassis 12 generate heat that must be dissipated. The electronic components may include, but are not limited to, hard drives 14, power supplies 18, processors 38, memory 40, and interface cards 42. In certain embodiments processors 38 are 120 Watt processors. The heat generated by the electronic components and the size of chassis 12 combine to give system 10 a total cooling load of at least 50 cubic feet per minute (CFM) of air at a static pressure of 2 inches of water or greater, where the CFM of air is the volumetric flow rate of air through chassis 12 and the static pressure of the airflow is the pressure differential across the chassis.

The cooling load of system 10 is a function of the power generated by the electronic components within chassis 12 and the volume available within chassis 12 for airflow. As the power generated by the system increases, the volumetric flow rate of air needed to cool the system increases. As the volume within which the system is packaged, i.e., the volume within the chassis, decreases the differential pressure needed to push the desired volumetric flow rate increases.

Thus, primary air mover 20 is able to provide airflow of at least 50 CFM at 2 inches of water or greater. Primary air mover 20 may be an axial flow fan or other type of air mover capable of providing the required flow rate and pressure for cooling computer system 10. Backup air mover 22 may be identical to primary air mover 20 and is provided as a redundant air mover in case of failure of the primary air mover. Both air movers 20, 22 are disposed within primary inlet 30 into plenum 26. Flow divider 28 controls the flow from the air movers into plenum 26. Although each air mover 20, 22 is preferably capable of providing the entire flow requirement, in certain embodiments, both air movers may operate at a reduced power such that a portion of the flow is generated by both air movers. Air also enters plenum 26 through in let 32. As high velocity air passes inlet 32 within plenum, air is pulled through the inlet and entrained with the airflow in the plenum. This entrainment of air through inlet 32 generates low velocity, low flow rate airflow over hard drives 14.

Inlets 30, 32 and outlets 34, 36 of plenum 16 are sized and arranged so as to direct the airflow across the electronic components. Plenum 26 is arranged so as to allocate the flow according to the heat produced by the various components. For example, if processors 38 are able to transfer heat at twice the rate of power supplies 18, then additional airflow can be directed across processors 38. Thus, plenum 26 distributes the airflow such that a greater percentage of the total airflow is directed to the components, or regions, having the highest heat transfer rates.

Thus, system 10 allows for an efficient use of space within chassis 12 by utilizing a minimum number of air movers 20, 22. Minimizing the number of air movers 20, 22 also reduces noise levels and power consumption as compared to conventional multi-fan systems. Air distribution system 24 then transforms the airflow generated by air movers 20, 22 and directs the airflow toward various components and regions of system 10 so that the cooling capacity of the airflow can be efficiently used.

The arrangement and configuration of an air distribution system will depend on the configuration of the various electronic components as well as the placement of the air movers and the volume available for airflow within the chassis. Thus, the features and design of the plenum will vary greatly and depends on the characteristics of the particular computer system for which the plenum is designed.

Figure 2:
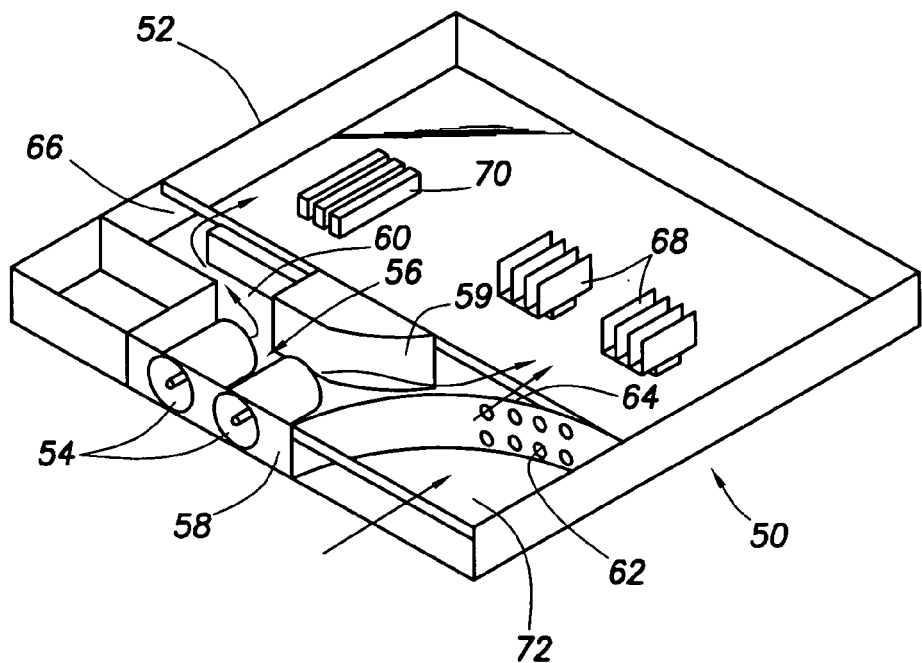
FIG. 2 shows a computer system comprising an asymmetrical air distribution system in accordance with embodiments of the invention.

Referring now to FIG. 2, computer system 50 comprises chassis 52, air movers 54, and plenum 56. Plenum 56 comprises inlet 58, high velocity channel 59, high flow rate channel 60, openings 62, high velocity outlet 64, and high flow outlet 66. Computer system 50 comprises finned heat sinks 68, memory modules 70, and low power region 72.

Finned heat sinks 68 allow a high rate of heat transfer from high power components, such as processors. Therefore, in order to maximize heat transfer from heat sinks 68, high velocity, high volumetric airflow is passed over the heat sink fins. Memory modules 70 are also capable of producing high amounts of heat but, instead of having a heat sink, the majority of the heat is transferred from the surface of the module. In order to transfer sufficient heat from memory modules 70, a lower volumetric flow rate of air can be utilized. Low power region 72 may contain lower heat producing components, such as hard drives, which can utilize an even lower volumetric flow rate airflow. Therefore, the airflow generated by air movers 54 can be transformed and distributed so as to efficiently cool the variety of electronic components.

In order to efficiently transform and distribute the airflow generated by air movers 54, plenum 56 divides the airflow into high velocity channel 59 and high flow rate channel 60. High velocity channel 58 is arranged so that the airflow maintains a high velocity in a substantially smooth path toward high velocity outlet 64. High flow rate channel 60 receives a higher percentage of the airflow but also comprises features that create pressure drops in the flow, thereby reducing the velocity at which the flow is traveling. The pressure drop may be achieved by features such as expansions in the channel and extending the path length the air must travel.

Openings 62 provide fluid communication into plenum 56. Because the flow within plenum 56 is traveling at a fairly high velocity, air is pulled through openings 62 and entrained with the airflow in the plenum. This entrainment of air through opening 62 generates low velocity, low flow rate airflow through low power region 72. Thus, by enabling an asymmetric distribution of the airflow, plenum 56 allows efficient use of the high velocity, high pressure airflow from a minimum number of air movers 54.

Figure 3:
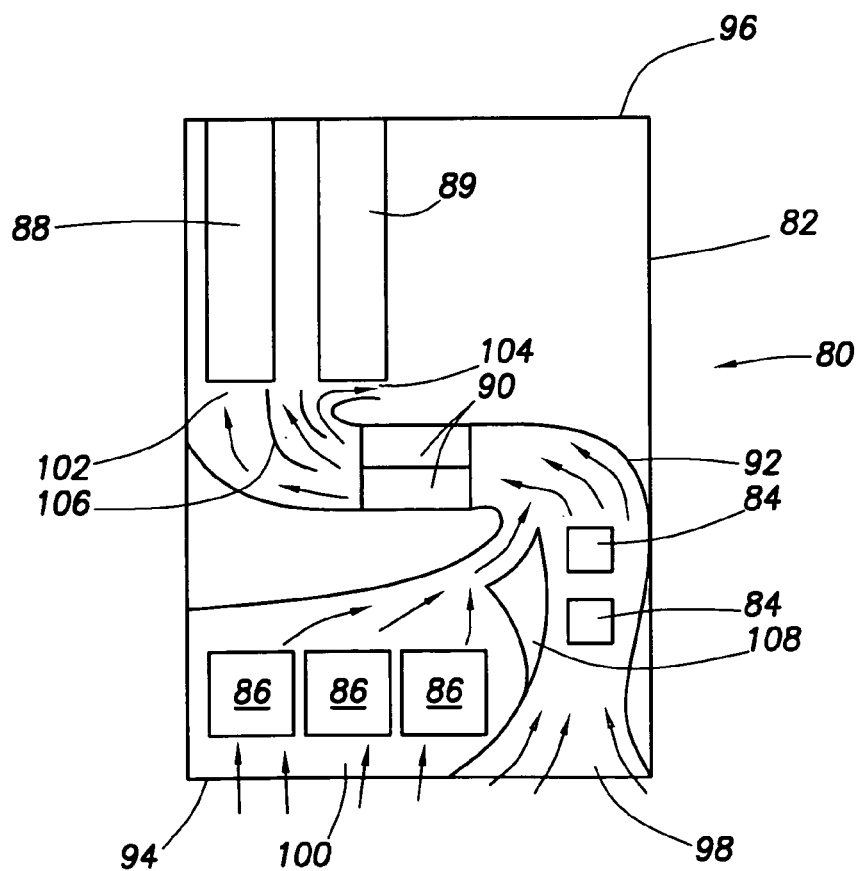
FIG. 3 shows a computer system comprising transverse-mounted air movers with an air distribution system in accordance with embodiments of the invention.

Referring now to FIG. 3, computer system 80 comprises chassis 82, processors 84, hard drives 86, power supply 88, option cards 89, air movers 90, and plenum 92. Chassis 82 has a front end 94 and back end 96. Plenum 92 directs air through inlets 98 and 100 in front end 94. Plenum 92 turns the airflow to be substantially aligned with air movers 90 that are positioned substantially parallel with front end 94. Plenum 92 then redirects the airflow from air movers 90 toward outlets 102 and 104. Plenum 92 may comprise internal guide vanes 106 and flow deflectors 108 to help move the airflow through the plenum.

Thus, plenum 92 transforms and directs the airflow generated by air movers 90 in order to provide a desired amount of airflow to the various electronic components within system 80. The air movers 90 needed to generate sufficient airflow for cooling system 80 may tend to have high acoustic emissions. Positioning air movers 90 near the center of chassis 80 and transverse to the main direction of airflow helps to reduce acoustic noise. Further, transverse air movers 90 may also allow the overall depth of chassis 80 to be reduced. Minimizing overall chassis depth may be desirable for fiber and other cable management at back end of rack-mounted equipment.

Figure 4:
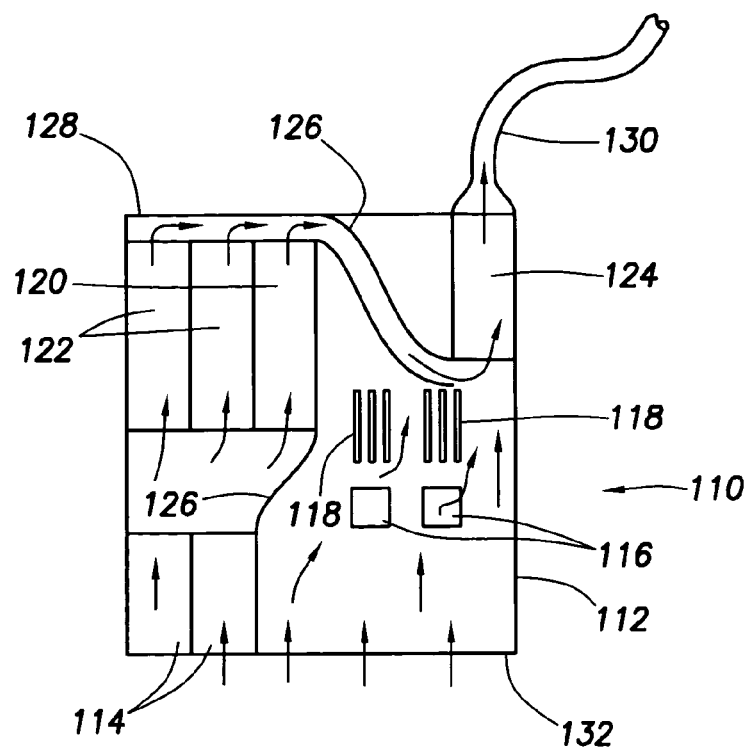
FIG. 4 shows a computer system comprising an exhaust duct for an air distribution system in accordance with embodiments of the invention.

Referring now to FIG. 4, computer system 110 comprises chassis 112, hard drives 114, processors 116, memory modules 118, expansion cards 120, power supplies 122, air mover 124, and plenum 126. Air mover 124 is positioned toward back end 128 of chassis 112 and coupled to an exhaust duct 130 that captures the airflow out of the air mover. Air is drawn into chassis 112 across front end 132 and plenum 126 directs the airflow across the system components toward air mover 124. Thus, the airflow exhausted from air mover 124 is heated and is removed by exhaust duct 130 to an external cooler or air conditioning system.

Figure 5:
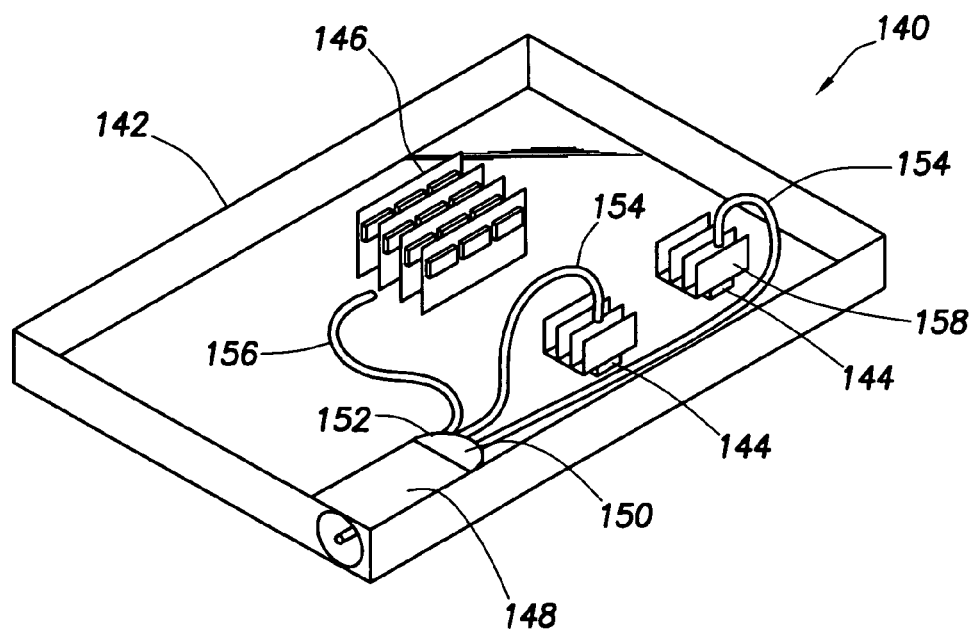
FIG. 5 shows a computer system comprising tubular conduit used with an air distribution system in accordance with embodiments of the invention.

Referring now to FIG. 5, computer system 140 comprises chassis 142, processors 144, memory modules 146, air mover 148, and air distribution system 150. Air distribution system 150 comprises exhaust plenum 152 and a plurality of tubular conduits 154, 156 that carry the airflow from air mover 148 to areas within chassis 140 that need cooling, such as processors 144 and memory modules 146. First tubular conduit 154 carries the airflow to processor 144 and impinges the airflow on the heat sink fins 158 of the processor. Second tubular conduit 156 carries the airflow to memory modules 146 and directs the air across the modules. Conduits 154 and 156 are sized such that an optimum flow is delivered directly to a component needed cooling. Additional tubular conduits can also be used to draw air over certain components and deliver airflow to air mover 148.

Any of the above discussed air distribution systems and techniques can be used in combination with other airflow management systems. The particular arrangement and configuration will depend on the particular computer system and the cooling requirements unique thereto. Therefore, any number of air-cooled systems could be developed using the principles and concepts discussed herein. Thus, the above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A computer system, comprising:
 a chassis;
 a plurality of electronic components disposed within said chassis, wherein said plurality of electronic components generate a cooling load of at least 50 CFM at 2 inches of water or greater;
 an air mover disposed within said chassis and operable to generate an airflow of at least 50 CFM at 2 inches of water or greater; and
 an air distribution system coupled to said air mover and operable to distribute the airflow to said plurality of electronic components.

2. The computer system of claim 1 wherein said air distribution system comprises a plenum that directs the airflow to said plurality of electronic components.

3. The computer system of claim 2 wherein said plurality of electronic components comprise:
 a processor having a power of at least 120 Watts;
 a power supply coupled to said processor; and
 a hard drive coupled to said processor.

4. The computer system of claim 3 wherein said plenum comprises:
 a primary inlet through which air is drawn into said air mover; and
 a secondary inlet that receives air drawn after it passes over said hard drive.

5. The computer system of claim 3 wherein said plenum further comprises:
 a first outlet that directs a first airflow across said processor; and
 a second outlet that directs a second airflow across said power supply,
 wherein the first airflow has a higher volumetric flow rate than the second airflow.

6. The computer system of claim 2 wherein said plenum further comprises:
 a first outlet that directs a first airflow across a first electronic component; and
 a second outlet that directs a second airflow across a second electronic component, wherein the first airflow has a higher volumetric flow rate than the second airflow.

7. The computer system of claim 2 wherein said plenum further comprises a plurality of openings that entrain air into said plenum.

8. The computer system of claim 2 wherein airflow into said chassis is substantially perpendicular to a front edge of said chassis and airflow out of said air mover is substantially parallel to the front edge of said chassis.

9. The computer system of claim 2 wherein said air mover comprises an inlet that draws airflow from said plenum and an exhaust that removes the airflow from said chassis.

10. The computer system of claim 9 further comprising a conduit coupled to the exhaust.

11. The computer system of claim 2 wherein said plenum further comprises a plurality of tubular conduits that direct the airflow from said air mover to said electronic components.

12. A computer system comprising:
 a chassis enclosing a first electronic component and a processor having a power of at least 120 Watts;
 an air mover disposed within said chassis and operable to generate an airflow having at least 50 CFM at 2 inches of water or greater;
 an air distribution system that directs a first portion of the airflow across the first electronic component and a second portion of the airflow across the processor.

13. The computer system of claim 12 wherein said air distribution system comprises a plenum that directs the airflow to the processor and the first electronic component.

14. The computer system of claim 13 wherein said plenum further comprises:
 a first outlet that directs the first portion of the airflow across the first electronic component; and
 a second outlet that directs the second portion of the airflow across the processor.

15. The computer system of claim 13 wherein said plenum further comprises one or more openings that entrain air into said plenum.

16. The computer system of claim 15 wherein the entrained air forms an airflow that passes over a third electronic component before entering said plenum.

17. The computer system of claim 13 wherein said plenum directs the airflow from an inlet that is substantially perpendicular to a front edge of said chassis and through said air mover that is substantially parallel to the front edge of said chassis.

18. The computer system of claim 13 wherein said air mover comprises an inlet that draws airflow from said plenum and an exhaust that removes the airflow from said chassis.

19. The computer system of claim 18 further comprising a conduit coupled to the exhaust.

20. The computer system of claim 13 wherein said plenum further comprises:
 a first tubular conduit that directs the first portion of the airflow from said air mover to the first electronic component; and
 a second tubular conduit that directs the second portion of the airflow from said air mover to the processor.

21. The computer system of claim 13 wherein the first electronic component is a power supply or a memory module.

22. A computer system, comprising:
 a chassis;
 a plurality of electronic components disposed within said chassis, wherein said plurality of electronic components generate a cooling load of at least 50 CFM at 2 inches of water or greater;
 an air mover disposed within said chassis and operable to generate an airflow of at least 50 CFM at 2 inches of water or greater; and
 means for distributing the airflow to said plurality of electronic components.

* * * * *